United States Patent
Ravindranath

(10) Patent No.: US 11,521,042 B2
(45) Date of Patent: Dec. 6, 2022

(54) SYSTEM AND METHOD TO DYNAMICALLY AND AUTOMATICALLY SHARING RESOURCES OF COPROCESSOR AI ACCELERATORS

(71) Applicant: Anil Ravindranath, Sunnyvale, CA (US)

(72) Inventor: Anil Ravindranath, Sunnyvale, CA (US)

( * ) Notice: Subject to any disclaimer, the term of this patent is extended or adjusted under 35 U.S.C. 154(b) by 869 days.

(21) Appl. No.: 16/418,523

(22) Filed: May 21, 2019

(65) Prior Publication Data

US 2019/0272461 A1    Sep. 5, 2019

(51) Int. Cl.
| | | |
|---|---|---|
| *G06F 9/46* | (2006.01) | |
| *G06N 3/04* | (2006.01) | |
| *G06N 3/08* | (2006.01) | |
| *G06F 9/48* | (2006.01) | |
| *G06F 9/38* | (2018.01) | |
| *G06F 9/50* | (2006.01) | |
| *G06F 30/34* | (2020.01) | |

(52) U.S. Cl.
CPC ......... *G06N 3/0454* (2013.01); *G06F 9/3836* (2013.01); *G06F 9/3877* (2013.01); *G06F 9/4881* (2013.01); *G06F 9/5016* (2013.01); *G06F 9/5027* (2013.01); *G06F 30/34* (2020.01); *G06N 3/08* (2013.01); *G06F 2209/5011* (2013.01)

(58) Field of Classification Search
CPC .................................................... G06F 9/4881
USPC ....................................................... 718/102
See application file for complete search history.

(56) References Cited

U.S. PATENT DOCUMENTS

| | | | | |
|---|---|---|---|---|
| 2012/0102291 | A1* | 4/2012 | Cherian | G06F 3/067 |
| | | | | 711/170 |
| 2015/0324707 | A1* | 11/2015 | Zhou | G06N 20/00 |
| | | | | 717/124 |
| 2017/0124451 | A1* | 5/2017 | Barham | G06N 3/063 |
| 2017/0168715 | A1* | 6/2017 | Eshwarappa | G06F 9/45558 |
| 2018/0046913 | A1* | 2/2018 | Yu | G06F 13/102 |
| 2018/0322606 | A1* | 11/2018 | Das | G06T 1/20 |
| 2019/0050265 | A1* | 2/2019 | Vijayaraghavan | |
| | | | | G06F 11/3024 |
| 2019/0205736 | A1* | 7/2019 | Bleiweiss | G06N 3/0454 |
| 2019/0205737 | A1* | 7/2019 | Bleiweiss | G06N 20/00 |

(Continued)

*Primary Examiner* — Mehran Kamran
(74) *Attorney, Agent, or Firm* — Barry Choobin; Patent 360

(57) ABSTRACT

A system and method for dynamically and automatically sharing resources of a coprocessor AI accelerator based on workload changes during training and inference of a plurality of neural networks. The method comprising steps of receiving a plurality of requests from each neural network and high-performance computing applications (HPCs) through a dynamic adaptive scheduler module. The dynamic adaptive scheduler module morphs the received requests into threads, dimensions and memory sizes. The method then receives the morphed requests from the dynamic adaptive scheduler module through client units. Each of the neural network applications is mapped with at least one of the client units on a graphics processing unit (GPU) hosts. The method then receives the morphed requests from the plurality of client units through a plurality of server units. Further, the method receives the morphed request from the plurality of server units through one or more coprocessors.

17 Claims, 5 Drawing Sheets

(56) References Cited

U.S. PATENT DOCUMENTS

| | | | | |
|---|---|---|---|---|
| 2019/0205745 A1* | 7/2019 | Sridharan | .............. | G06N 3/084 |
| 2019/0304054 A1* | 10/2019 | Appu | ..................... | G09G 5/363 |
| 2019/0312772 A1* | 10/2019 | Zhao | ..................... | H04L 41/12 |
| 2019/0325303 A1* | 10/2019 | Daga | ..................... | G06N 3/063 |
| 2019/0325307 A1* | 10/2019 | Li | ........................... | G06N 3/08 |
| 2019/0370071 A1* | 12/2019 | Matveev | .................. | G06N 3/08 |
| 2020/0042362 A1* | 2/2020 | Cui | ....................... | G06K 9/6274 |
| 2020/0174840 A1* | 6/2020 | Zhao | ..................... | G06N 3/084 |
| 2020/0201648 A1* | 6/2020 | Memon | ..................... | G06F 9/54 |
| 2020/0293369 A1* | 9/2020 | Maiyuran | ........... | G06F 9/30123 |
| 2020/0293380 A1* | 9/2020 | Ashbaugh | ............... | G06F 9/545 |
| 2021/0026696 A1* | 1/2021 | Chen | ........................ | G06T 1/20 |
| 2021/0216375 A1* | 7/2021 | Sivaraman | ............. | G06F 9/546 |
| 2022/0083389 A1* | 3/2022 | Poothia | ................. | G06F 9/5027 |
| 2022/0092439 A1* | 3/2022 | Liu | .......................... | G06N 5/04 |
| 2022/0100566 A1* | 3/2022 | Ylinen | ................. | G06F 9/5038 |

* cited by examiner

SYSTEM AND METHOD TO DYNAMICALLY AND AUTOMATICALLY SHARING RESOURCES OF COPROCESSOR AI ACCELERATORS

FIELD OF INVENTION

The present invention relates to dynamic sharing of resources, in particular to system and method to dynamically and automatically sharing resources of coprocessor AI accelerators based on workload changes during training and inference of neural networks.

BACKGROUND

With the advent of the artificial intelligence (AI) technologies, coprocessors such as Graphics Processing Units (GPUs), Field Programmable Gate Arrays (FPGAs), Tensor Processing Unit (TPUs) and custom AI chips are a must for Artificial Intelligence and high-performance computing (HPC) applications. Typically, HPC and AI applications compute a huge number of number crunching like matrix multiplications in parallel to derive a result which increases the usage of a large number of cores for parallel programming. CPUs typically have very less number of cores and are not suitable for AI and HPC applications. Unlike CPUs, coprocessors (GPUs, FPGAs, TPUs, AI chips) have many numbers of cores in thousands which enable parallel processing in order of hundreds and thousands of threads to run in parallel.

Currently, there are various challenges while using the coprocessors for HPC and AI applications. There is a huge underutilization of coprocessors leading to the idleness of coprocessors. The underutilization could be because of slow data transfers to coprocessors. To maximize utilization, more applications can access and share the coprocessor at the same time in parallel. But currently, it can be a static and fixed allocation of shares.

The AI Neural Networks and HPC applications compute thousands of calculations quickly due to coprocessor chips (GPUs, FPGAs, TPUs, AI chips) which have unique parallel programming capability. The parallelism in the coprocessors is achieved by having thousands of cores distributed in a tiered distribution as "threads" into a "block" and blocks into a "grid". The threads, blocks, and grids take requests and compute in parallel into thousands of cores. Further, AI Neural Networks build requests into threads→blocks→grid fashion and send it to the coprocessor for computing.

Currently, the resources such as cores and memory of the coprocessors can be shared statically. Each application sharing then can set the share first and start using a specific share. However, the AI Neural network and HPC applications workloads change dynamically, and there is no way an application would know how much share is optimal and required over the life of the application.

Typically AI neural network and HPC applications change based on various parameters like data batch size, filters they use for convoluting the matrices, the dimension/size of the matrix. The allocated shares go either unused, or application needs more share dynamically resulting in the underperforming application and less accurate prediction of a Neural network application.

FIG. 2 illustrates "static" allocations of coprocessor resources such as memory before starting the neural networks training/inference. The applications set the resource allocation of the coprocessor and cannot change it dynamically even though the application may not use that much resources at all times.

It is, therefore, a need for a reliable, and efficient system and method to dynamically and automatically sharing resources of coprocessor based on workload changes during training and inference of neural networks.

SUMMARY

The present invention mainly deals the technical problems existing in the prior art. in response to these problems, the present invention provides a system and method for dynamically and automatically sharing one or more resources of a coprocessor AI accelerator based on a plurality of workload changes during training and inference of a plurality of neural networks.

An aspect of the present invention relates to a system to dynamically and automatically sharing one or more resources of a coprocessor based on a plurality of workload changes during training and inference of a plurality of neural networks. The system comprises a dynamic adaptive scheduler module, a plurality of client units, a plurality of server units, and one or more coprocessors. The dynamic adaptive scheduler module is configured to receive a plurality of requests from each neural network and a plurality of high-performance computing applications (HPCs). The dynamic adaptive scheduler module morphs the received requests into a plurality of threads, a plurality of dimensions and a plurality of memory sizes. The plurality of client units receive the morphed requests from the dynamic adaptive scheduler module. Each of the neural network applications is mapped with at least one of the client units on a plurality of graphics processing unit (GPU) hosts. The plurality of server units receive the morphed requests from the plurality of client units. The one or more coprocessors receive the morphed request from the plurality of server units.

In an aspect, the coprocessors comprise a plurality of graphics processing units (GPUs), Field Programmable Gate Arrays (FPGAs), and a plurality of Artificial Intelligence (AI) Accelerators.

In another aspect of the present system, the dynamic adaptive scheduler module computes the dimensions of each of the received request and dynamically assigns the dimensions for each of the received requests.

In a further aspect of the present system, the dynamic adaptive scheduler module computes a number of threads, and memory size required and allocates cores and memory on the coprocessors.

In yet a further aspect of the present system, the dynamic adaptive scheduler module dynamically changes the allocations of the memory resources of the coprocessors based on a plurality of hyper parameters.

In yet a further aspect of the present system, the dynamic adaptive scheduler module computes the utilization of the resources of the coprocessors for the received requests dynamically based on a learning module.

Yet, an aspect of the present system, one or more resources of a coprocessor comprises cores, threads, and memory.

Yet, an aspect of the present system, the plurality of graphics processing units (GPUs), Field Programmable Gate Arrays (FPGAs), and Artificial Intelligence (AI) Accelerators are collected as a GPU pool by an orchestrator.

An aspect of the present invention relates to a method for dynamically and automatically sharing one or more resources of a coprocessor AI accelerator based on a plurality of workload changes during training and inference of a plurality of neural networks. The method includes a step of receiving a plurality of requests from each neural network and a plurality of high-performance computing applications (HPCs) through a dynamic adaptive scheduler module. The dynamic adaptive scheduler module morphs the received requests into a plurality of threads, a plurality of dimensions and a plurality of memory sizes.

The method includes a step of receiving the morphed requests from the dynamic adaptive scheduler module through a plurality of client units. Each of the neural network applications is mapped with at least one of the client units on a plurality of graphics processing unit (GPU) hosts. The method further includes the step of receiving the morphed requests from the plurality of client units through a plurality of server units. Furthermore, the method includes the step of receiving the morphed request from the plurality of server units through one or more coprocessors. The coprocessors comprise a plurality of graphics processing units (GPUs), Field Programmable Gate Arrays (FPGAs), and a plurality of Artificial Intelligence (AI) Accelerators.

Accordingly, one advantage of the present invention is that it dynamically shares coprocessor resources for every request for a neural network and HPC application based on characteristics of the request without any user intervention.

Accordingly, one advantage of the present invention is that it executes multiple applications in parallel based on the utilization of the coprocessor and maximizes the valuable coprocessor resources to the fullest and improves the utilization.

Accordingly, one advantage of the present invention is that it dynamically sets a percentage of resources for each application.

Accordingly, one advantage of the present invention is that it may abstract the client's request to the coprocessor and changes the request to meet the service level agreement (SLAs) as set by the client Other features of embodiments of the present invention will be apparent from accompanying drawings and from the detailed description that follows.

BRIEF DESCRIPTION OF THE DRAWINGS

In the figures, similar components and/or features may have the same reference label. Further, various components of the same type may be distinguished by following the reference label with a second label that distinguishes among the similar components. If only the first reference label is used in the specification, the description applies to any one of the similar components having the same first reference label irrespective of the second reference label.

DETAILED DESCRIPTION

Figure 1:
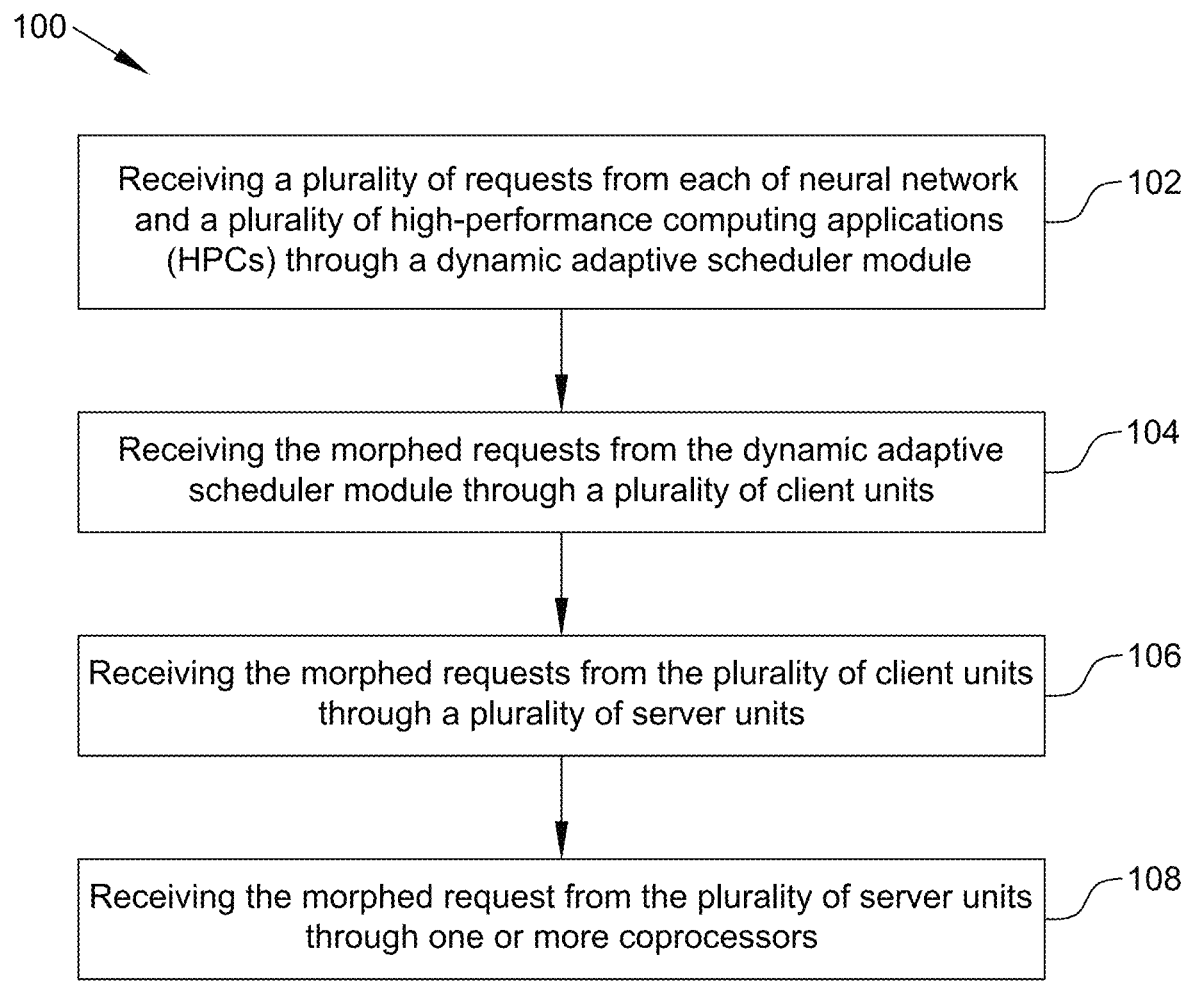
FIG. 1 illustrates a flowchart of a method for dynamically and automatically sharing one or more resources of a coprocessor AI accelerator based on a plurality of workload changes during training and inference of a plurality of neural networks, in accordance with an embodiment of the present invention.

Systems and methods are disclosed for dynamically and automatically sharing one or more resources of a coprocessor based on a plurality of workload changes during training and inference of a plurality of neural networks. Embodiments of the present invention include various steps, which will be described below. The steps may be performed by hardware components or may be embodied in machine-executable instructions, which may be used to cause a general-purpose or special-purpose processor programmed with the instructions to perform the steps. Alternatively, steps may be performed by a combination of hardware, software, firmware, and/or by human operators.

Various methods described herein may be practiced by combining one or more machine-readable storage media containing the code according to the present invention with appropriate standard computer hardware to execute the code contained therein. An apparatus for practicing various embodiments of the present invention may involve one or more computers (or one or more processors within a single computer) and storage systems containing or having network access to computer program(s) coded in accordance with various methods described herein, and the method steps of the invention could be accomplished by modules, routines, subroutines, or subparts of a computer program product.

Although the present invention has been described with the purpose of dynamically and automatically sharing resources of a coprocessor based on workload changes during training and inference of a plurality of neural networks, it should be appreciated that the same has been done merely to illustrate the invention in an exemplary manner and any other purpose or function for which explained structures or configurations could be used, is covered within the scope of the present invention.

Typically, coprocessors are used for parallel programming. It means coprocessors have to execute many threads in parallel for faster computing. The threads are typically divided into a set of blocks, and a set of blocks are divided into grids. This enables the coprocessor to schedule blocks and threads in parallel. Neural Networks and HPC applications send request typically follow this method to send requests to the coprocessor for parallel programming. It means the request is divided into three dimensions based on coprocessor properties. Set of threads into blocks into grids.

However, the issue is the HPC application does not know what dimensions result in better "utilization" of the coprocessor. Higher utilization means better performance. For example, the application could send a request in 1024 threads, 2 Blocks, 1 grid. This may result in utilization of 45% cores of the coprocessor. But application assumes that it is utilizing 100% of cores. This results in underutilization of valuable coprocessor resources. The dynamic adaptive scheduler module of the present system and method calculate the utilization of coprocessor resources for requests dynamically based on a learning algorithm.

Exemplary embodiments will now be described more fully hereinafter with reference to the accompanying drawings, in which exemplary embodiments are shown. This invention may, however, be embodied in many different forms and should not be construed as limited to the embodiments set forth herein. These embodiments are provided so that this invention will be thorough and complete and will fully convey the scope of the invention to those of ordinary skill in the art. Moreover, all statements herein reciting embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Thus, for example, it will be appreciated by those of ordinary skill in the art that the diagrams, schematics, illustrations, and the like represent conceptual views or processes illustrating systems and methods embodying this invention. The functions of the various elements shown in the figures may be provided through the use of dedicated hardware as well as hardware capable of executing associated software. Similarly, any switches shown in the figures are conceptual only. Their function may be carried out through the operation of program logic, through dedicated logic, through the interaction of program control and dedicated logic, or even manually, the particular technique being selectable by the entity implementing this invention. Those of ordinary skill in the art further understand that the exemplary hardware, software, processes, methods, and/or operating systems described herein are for illustrative purposes and, thus, are not intended to be limited to any particular name.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail to avoid obscuring the embodiments.

FIG. 1 illustrates a flowchart 100 of a method for dynamically and automatically sharing one or more resources of a coprocessor AI accelerator based on a plurality of workload changes during training and inference of a plurality of neural networks, in accordance with an embodiment of the present invention. In an embodiment, one or more resources of a coprocessor comprise cores, threads, and memory. In an embodiment, the coprocessors comprise a plurality of graphics processing units (GPUs), Field Programmable Gate Arrays (FPGAs), and a plurality of Artificial Intelligence (AI) Accelerators or AI chips. Examples of the Artificial Intelligence (AI) Accelerators include but not limited to TPU (Tensor Processor Unit), IPUs (Intelligence Processor Unit), DPU (DataFlow processor Unit)

The method includes a step 102 of receiving a plurality of requests from each neural network and a plurality of high-performance computing applications (HPCs) through a dynamic adaptive scheduler module. Examples of high-performance computing applications (HPCs) includes but not limited to MATLAB, OpenFOAM, ANSYS, etc. The dynamic adaptive scheduler module morphs the received requests into a plurality of threads, a plurality of dimensions and a plurality of memory sizes. In another embodiment, the dynamic adaptive scheduler module computes the dimensions of each of the received request and dynamically assigns the dimensions for each of the received requests.

In an embodiment, the dynamic adaptive scheduler module computes a number of threads, and memory size required and allocates cores and memory on the coprocessors. In yet a further embodiment, the dynamic adaptive scheduler module dynamically changes the allocations of the memory resources of the coprocessors based on a plurality of hyperparameters. In yet a further embodiment, the dynamic adaptive scheduler module computes the utilization of the resources of the coprocessors for the received requests dynamically based on a learning module.

The method includes a step 104 of receiving the morphed requests from the dynamic adaptive scheduler module through a plurality of client units. Each of the neural network applications is mapped with at least one of the client units on a plurality of graphics processing unit (GPU) hosts. In an embodiment, wherein the plurality of graphics processing units (GPUs), Field Programmable Gate Arrays (FPGAs), and Artificial Intelligence (AI) Accelerators are collected as a GPU pool by an orchestrator.

The method further includes the step 106 of receiving the morphed requests from the plurality of client units through a plurality of server units. Furthermore, the method includes the step 108 of receiving the morphed request from the plurality of server units through one or more coprocessors. The coprocessors comprise a plurality of graphics processing units (GPUs), Field Programmable Gate Arrays (FPGAs), and a plurality of Artificial Intelligence (AI) Accelerators.

Figure 2:
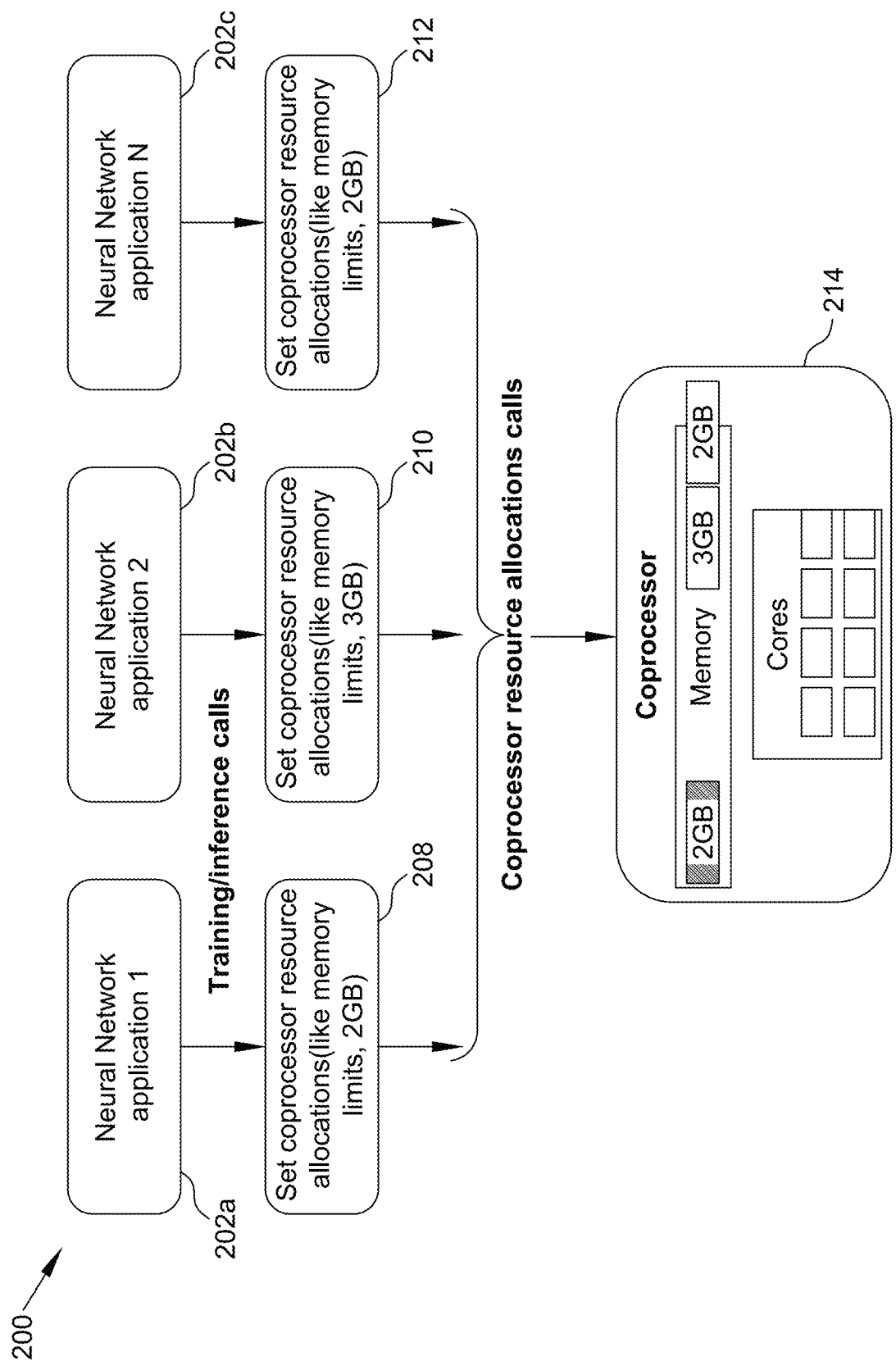
FIG. 2 illustrates an exemplary block diagram of "static" allocations of resources of the coprocessor such as memory before starting neural networks training/inference, in accordance with an embodiment of the present invention.

FIG. 2 illustrates an exemplary block diagram 200 of "static" allocations of resources of the coprocessor such as memory before starting neural networks training/inference, in accordance with an embodiment of the present invention. The various neural network applications 202a, 202b, and 202c set the various coprocessor resource allocations 208a, 208b, and 208c of the coprocessor 214 and cannot change it dynamically even though the neural network applications 202a, 202b, and 202c may not use that much resources such as memory and cores at all times.

Various hyper parameters determine the structure of a neural network. Further, hyper parameters determine how the network is trained which is called as a learning rate. Hyper parameters are used in the neural network training and change for each training session and between applications. Also, the hyper parameters change dynamically while training.

Typical hyper parameters include but not limited to data batch size, layers of the neural network, filter size of convoluting a matrix, stride size, etc. The hyper parameters (not limited to) may change between training sessions within an application and between applications.

For example, for a higher number of layers, it requires more threads and more cores in the coprocessor. In case of a higher data batch size, more memory is required in the coprocessor for that training session. Further, if the matrix dimension size is big, it means more elements are computed which lead to more threads in the coprocessor The computational cores of the coprocessors are divided into a set of blocks, and a set of blocks are divided into a set of grids. The neural networks compute their matrices in thread/block/grid dimensions based on the application request matrix size.

Table 1 depicts the coprocessor consumption in terms of thread/core and memory varies based on the training and its hyper parameters.

|  |  | Training 1<br>32 × 32 matrix | Training 2<br>64 × 64 matrix |
|---|---|---|---|
| Coprocessor consumption | Threads | 1024 | 4096 |
|  | Dimension | 2 grids, 16 × 16 block size | 2 grids, 32 × 32 block size |
| Data Batch Size | Number of Images | 32 | 64 |
|  | Dataset Size | 1 GB | 2 GB |
|  | Memory consumption | 1 GB | 2 GB |

Figure 3:
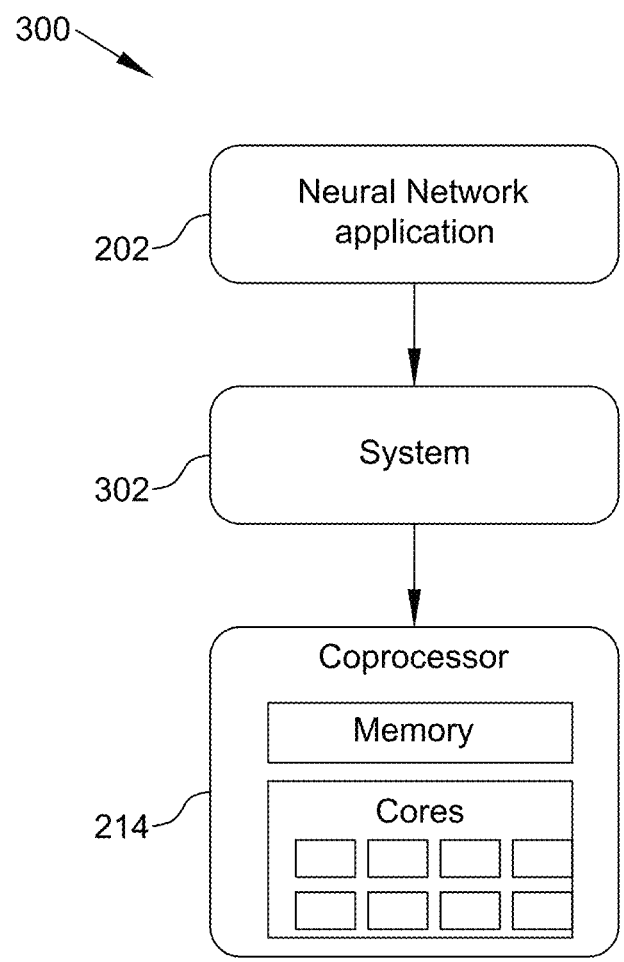
FIG. 3 illustrates an exemplary flowchart to dynamically allocate shares of the resources of coprocessor based on the workload changes during neural network application training and inference, in accordance with an embodiment of the present invention.

FIG. 3 illustrates an exemplary flowchart 300 to dynamically allocate shares of the resources such as cores threads and memory of coprocessor AI accelerator based on the workload changes during neural network application training and inference, in accordance with an embodiment of the present invention. The present method intercepts the AI neural network and HPC application calls to the coprocessor and changes the properties of the occupancy of the coprocessor based on the workload.

The Neural Network and HPC applications 202 issue parallel programming calls to coprocessor 214 to compute their application. The parallel programming calls use resources (memory and cores) in the coprocessor. Further, the parallel programming calls have a specific pattern and features which change from call to call. For example, Application #1, request #1 issues a parallel programming call with "num of layers=5". This will constitute 100 threads or 100 cores at coprocessor. Further, request #2 issues a parallel programming call with "num of layers=50" which will constitute 5000 threads or 5000 cores at coprocessor and this behavior continues over the life of the application. But the application first itself allocates 50% of a coprocessor and always reserves 5000 threads/cores irrespective of whether the application needs it or not over time.

The present system 302 changes the properties of the occupancy of the coprocessor 214 based on the workload. Then the system 302 intercepts every parallel programming call that comes from neural network application 202 and dynamically allocates only "required amount" coprocessor resources per call, thereby allowing dynamic allocation of resources per call per-application basis.

Figure 4:
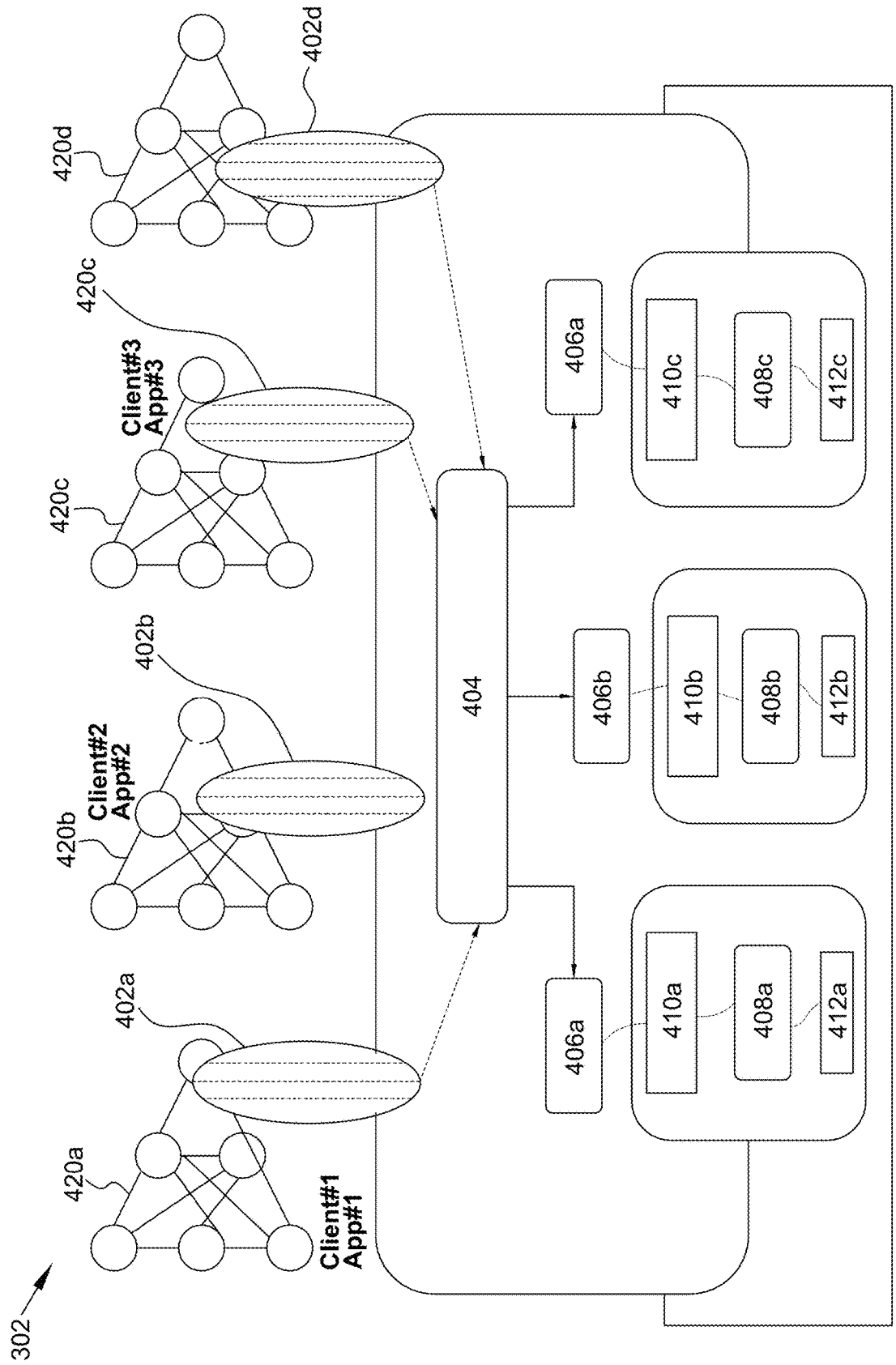
FIG. 4 illustrates a block diagram of a system to dynamically and automatically sharing one or more resources of a coprocessor AI accelerator based on a plurality of workload changes during training and inference of a plurality of neural networks, in accordance with an embodiment of the present invention.

FIG. 4 illustrates a block diagram of a system 302 to dynamically and automatically sharing one or more resources of a coprocessor AI accelerator based on a plurality of workload changes during training and inference of a plurality of neural networks, in accordance with an embodiment of the present invention. In an embodiment, one or more resources of a coprocessor comprise cores, threads, and memory. The system 302 comprises a dynamic adaptive scheduler module 404, a plurality of client units 406a, 406b, and 406c, a plurality of server units 408a, 408b, and 408c and one or more coprocessors 412a, 412b, and 412c.

The dynamic adaptive scheduler module 404 is configured to receive a plurality of requests 402a, 402b, 402c, and 402d from each neural network and a plurality of high-performance computing applications (HPCs). The dynamic adaptive scheduler module 404 morphs the received requests into a plurality of threads, a plurality of dimensions and a plurality of memory sizes. In another embodiment, the dynamic adaptive scheduler module 404 computes the dimensions of each of the received request 402a, 402b, 402c, and 402d and dynamically assigns the dimensions for each of the received requests 402a, 402b, 402c, and 402d.

In an embodiment, the dynamic adaptive scheduler module 404 computes a number of threads, and memory size required and allocates cores and memory on the coprocessors. In an embodiment, the dynamic adaptive scheduler module 404 dynamically changes the allocations of the memory resources of the coprocessors based on a plurality of hyperparameters. In an embodiment, the dynamic adaptive scheduler module 404 computes the utilization of the resources of the coprocessors for the received requests dynamically based on a learning module.

The plurality of client units 406a, 406b, and 406c receive the morphed requests from the dynamic adaptive scheduler module 404. Each of the neural network applications is mapped with at least one of the client units 406a, 406b, and 406c on a plurality of graphics processing unit (GPU) hosts 412a, 410b, and 410c. The plurality of server units 408a, 408b, and 408c receive the morphed requests from the plurality of client units. In an embodiment, there are multiple client units 406a, 406b, and 406c per GPS host. In an embodiment, there are one server unit per GPU host.

The one or more coprocessors 412a, 412b, and 412c receive the morphed request from the plurality of server units 406a, 406b, and 406c. In an embodiment, the coprocessors 412a, 412b, and 412c comprise graphics processing units (GPUs), Field Programmable Gate Arrays (FPGAs), and Artificial Intelligence (AI) Accelerators. In an embodiment, the graphics processing units (GPUs), Field Programmable Gate Arrays (FPGAs), and Artificial Intelligence (AI) Accelerators are collected as a GPU pool by an orchestrator. All the GPUs across the GPU pool are visible to the present system 302.

In an embodiment, the dynamic adaptive scheduler module 404 calculates the required dimensions of each request as they arrive. For every request, the dimensions are set dynamically. The requests 402a, 402b, 402c, and 402d are generated by a plurality of clients and applications 420a, 420b, 420c, and 420d.

For example, Client #1, App #1 420a sends four requests 402a as the training progresses:
Req #1: 12×12 dataset image, num of layers=4×4, filter size=2×2, dataset size=100 MB
Req #2: 12×12 dataset image, num of layers=8×8, filter size=4×4, dataset size=100 MB
Req #3: 24×24 dataset image, num of layers=8×8, filter size=4×4, dataset size=200 MB For each request, the present system 302 dynamically sets the "only" required dimensions and calculates the number of threads and memory size required and allocates cores and memory on the coprocessor accordingly.

For example, if Req #1 is a 12×12 matrix with a filter size of 2×2, it means every request will be a 2×2 matrix. It means it needs 4 threads in a block.

Percentage=size of the request/total num of available cores in the coprocessor

For example, percentage for a 32×32 would=(32×32/4000) times 100=25%. The rest 75% of cores are sharable to other requests in the queue.

If the present system gets three (3) requests in the queue to the dynamic adaptive scheduler module 404, The dynamic adaptive scheduler module 404 dynamically calculates the required number of thread/cores in the coprocessor for each request and allocates those many threads.

Req #1 percentage=25%, Req #2 percentage=35%, Req #3=40%

If in case the required number of threads are not available, the scheduler will route the request to another coprocessor in the system for that percentage of threads. The dynamic adaptive scheduler module 404 dynamically changes the allocations of coprocessor memory resources based on the hyper parameters.

For example, in a Neural Network training typically as new layers are added and images based on the resolution the coprocessor memory requirements change.

2×2 image, batch size=32, memory allocation required=600 MB

2×2 image, batch size=64, memory allocation required=1.2 GB

1024×1024 images, batch size=32, memory allocation required=6 GB

Currently, the memory allocations are performed by taking total coprocessor memory without considering the required memory allocation at a given point of time. The dynamic adaptive scheduler module 404 looks into "bytes in use" method to calculate the memory allocation dynamically and allocates only required memory, thereby saving memory for other training/process.

The dynamic adaptive scheduler module 404 calculates the utilization of coprocessor resources for requests dynamically based on a learning algorithm. In operation, the learning algorithm builds a table of dimension layout of coprocessor (threads, blocks, grids, memory) on discovering the coprocessor device and sends sample requests and collects the utilization of each sample requests and puts it in the table. Thus the learning algorithm learns heuristically what dimension will result in what utilization and what is the performance. All this is collected and input into a table.

When Neural network or an HPC application sends its request, the dynamic adaptive scheduler module 404 "abstract" the request and create a new request and change the dimension based on a "learning system" information and sends the request. If in case, the request is new and the learning system did not see it before, the table is updated with this new request. The learning algorithm enables the present system and method to determine exact utilization for "every request" and if in case there is any underutilization, the present system and method serve other client requests parallely to help in "multi-tenancy" of AI neural networks applications to run in parallel without any user-specific allocations or interventions.

Figure 5:
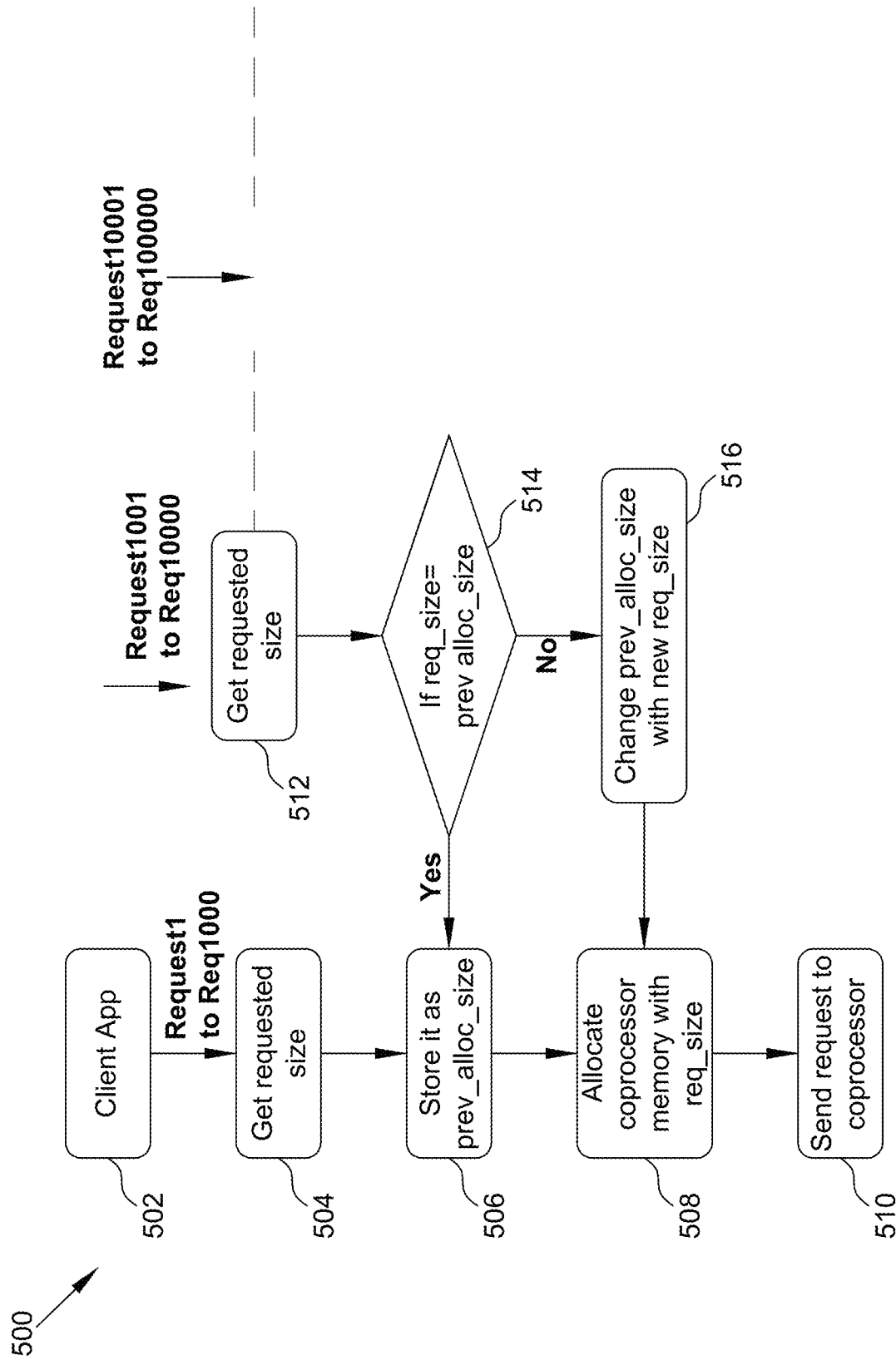
FIG. 5 illustrates a flowchart of one or more operations performed by a dynamic adaptive scheduler module, in accordance with an embodiment of the present invention.

FIG. 5 illustrates a flowchart 500 of one or more operations performed by a dynamic adaptive scheduler module, in accordance with an embodiment of the present invention. The dynamic adaptive scheduler module 404 looks into "bytes in use" method to calculate the memory allocation dynamically and allocates only required memory, thereby saving memory for other training/process. At step 502, the client application initiates a request for required size. At step 504, the request for the required size is received. At step 506, the requested size is stored as the previously allocated size. At step 508, the coprocessor memory is allocated with the requested size. At step 510, the request is transmitted to the coprocessor. At step 512, in an exemplary embodiment, the request size is received. At step 514, in case the requested size is equal to the previously allocated size, the loop proceeds to step 506. In case the requested size is not equal to the previously allocated size, the loop proceeds to step 516 to change the previously allocated size with new requested size. The operations performed by the dynamic adaptive scheduler module follows the following exemplary logic:

Req1-Req1000=1 GB of coprocessor memory
Req1001-Req10000=changes to 2 GB
Req10001-Req100000=changes to 3 GB The present system continuously monitors, and on detecting that request characteristics, it starts allocating the new size.

Thus the present system and method allow AI and HPC applications to dynamically share coprocessor resources for every request for a neural network and HPC application based on characteristics of the request without any user intervention. Further, the present system and method execute multiple applications in parallel based on coprocessor utilization by identifying hyper parameters (data batch size, layers of the neural network, etc.).

While embodiments of the present invention have been illustrated and described, it will be clear that the invention is not limited to these embodiments only. Numerous modifications, changes, variations, substitutions, and equivalents will be apparent to those skilled in the art, without departing from the scope of the invention, as described in the claims.

The invention claimed is:

1. A device in a network, comprising:
a non-transitory storage device having embodied therein one or more routines operable to dynamically and automatically sharing one or more resources of a coprocessor AI accelerator based on a plurality of workload changes during training and inference of a plurality of neural networks; and
one or more processors coupled to the non-transitory storage device and operable to execute the one or more routines, wherein the one or more routines comprises:
a dynamic adaptive scheduler module configured to receive a plurality of requests from each of a neural network and a plurality of high-performance computing applications (HPCs), wherein the dynamic adaptive scheduler module is configured to compute dimensions of each of the received plurality of requests, wherein the dynamic adaptive scheduler module is further configured to group the received requests into a plurality of threads, a plurality of dimensions and a plurality of memory sizes;
a plurality of client units configured to receive the grouped requests from the dynamic adaptive scheduler module, wherein each of the neural networks is mapped with at least one of the client units on a plurality of graphics processing unit (GPU) hosts;
a plurality of server units configured to receive the grouped requests from the plurality of client units; and
one or more coprocessors configured to receive the grouped request from the plurality of server units, wherein the coprocessors comprise a plurality of graphics processing units (GPUs), Field Programmable Gate Arrays (FPGAs), and a plurality of Artificial Intelligence (AI) Accelerators,
wherein the dynamic adaptive scheduler module is further configured to compute the utilization of the resources of the one or more coprocessors for the received requests dynamically based on a learning module.

2. The device according to claim 1, wherein the dynamic adaptive scheduler module computes a number of threads, and memory size required and allocates cores and memory on the coprocessors.

3. The device according to claim 1, wherein the dynamic adaptive scheduler module dynamically changes the allocations of the memory resources of the coprocessors based on a plurality of hyperparameters.

4. The device according to claim 1, wherein one or more resources of a coprocessor comprises cores, threads, and memory.

5. The device according to claim 1, wherein the plurality of graphics processing units (GPUs), Field Programmable Gate Arrays (FPGAs), and Artificial Intelligence (AI) Accelerators are collected as a GPU pool by an orchestrator.

6. A system to dynamically and automatically sharing one or more resources of a coprocessor AI accelerator based on a plurality of workload changes during training and inference of a plurality of neural networks, the system comprises:
a dynamic adaptive scheduler module configured to receive a plurality of requests from each of neural network and a plurality of high-performance computing applications (HPCs), wherein the dynamic adaptive scheduler module groups the received requests into a plurality of threads, a plurality of dimensions and a plurality of memory sizes;
a plurality of client units to receive the grouped requests from the dynamic adaptive scheduler module, wherein each of the neural networks is mapped with at least one of the client units on a plurality of graphics processing unit (GPU) hosts;
a plurality of server units to receive the grouped requests from the plurality of client units; and
one or more coprocessors to receive the grouped request from the plurality of server units, wherein the coprocessors comprise a plurality of graphics processing units (GPUs), Field Programmable Gate Arrays (FPGAs), and a plurality of Artificial Intelligence (AI) Accelerators,
wherein the dynamic adaptive scheduler module computes the utilization of the resources of the coprocessors for the received requests dynamically based on a learning module.

7. The system according to claim 6, wherein the dynamic adaptive scheduler module computes the dimensions of each of the received requests for grouping.

8. The system according to claim 6, wherein the dynamic adaptive scheduler module computes a number of threads, and memory size required and allocates cores and memory on the coprocessors.

9. The system according to claim 6, wherein the dynamic adaptive scheduler module dynamically changes the allocations of the memory resources of the coprocessors based on a plurality of hyperparameters.

10. The system according to claim 6, wherein one or more resources of a coprocessor comprises cores, threads, and memory.

11. The system according to claim 6, wherein the plurality of graphics processing units (GPUs), Field Programmable Gate Arrays (FPGAs), and Artificial Intelligence (AI) Accelerators are collected as a GPU pool by an orchestrator.

12. A method for dynamically and automatically sharing one or more resources of a coprocessor AI accelerator based on a plurality of workload changes during training and inference of a plurality of neural networks, the method comprising steps of:
receiving, by one or more processors, a plurality of requests from each of neural network and a plurality of high-performance computing applications (HPCs) through a dynamic adaptive scheduler module, wherein the dynamic adaptive scheduler module groups the received requests into a plurality of threads, a plurality of dimensions and a plurality of memory sizes;
receiving, by one or more processors, the grouped requests from the dynamic adaptive scheduler module through a plurality of client units, wherein each of the neural networks is mapped with at least one of the client units on a plurality of graphics processing unit (GPU) hosts;
receiving, by one or more processors, the grouped requests from the plurality of client units through a plurality of server units; and
receiving, by one or more processors, the grouped requests from the plurality of server units through one or more coprocessors, wherein the coprocessors comprise a plurality of graphics processing units (GPUs), Field Programmable Gate Arrays (FPGAs), and a plurality of Artificial Intelligence (AI) Accelerators,
wherein the dynamic adaptive scheduler module computes the utilization of the resources of the coprocessors for the received requests dynamically based on a learning module.

13. The method according to claim 12, wherein the dynamic adaptive scheduler module computes the dimensions of each of the received requests for grouping.

14. The method according to claim 12, wherein the dynamic adaptive scheduler module computes a number of threads, and memory size required and allocates cores and memory on the coprocessors.

15. The method according to claim 12, wherein the dynamic adaptive scheduler module dynamically changes the allocations of the memory resources of the coprocessors based on a plurality of hyperparameters.

16. The method according to claim 12, wherein one or more resources of a coprocessor comprises cores, threads, and memory.

17. The method according to claim 12, wherein the plurality of graphics processing units (GPUs), Field Programmable Gate Arrays (FPGAs), and Artificial Intelligence (AI) Accelerators are collected as a GPU pool by an orchestrator.

* * * * *